US010438877B1

(12) United States Patent
Palagud et al.

(10) Patent No.: US 10,438,877 B1
(45) Date of Patent: Oct. 8, 2019

(54) MULTI-CHIP PACKAGES WITH STABILIZED DIE PADS

(71) Applicant: SEMICONDUCTOR COMPONENTS INDUSTRIES, LLC, Phoenix, AZ (US)

(72) Inventors: Jose Felixminia Palagud, Seremban (MY); Soon Wei Wang, Seremban (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/919,516

(22) Filed: Mar. 13, 2018

(51) Int. Cl.
*H01L 23/495* (2006.01)
*H01L 25/16* (2006.01)

(52) U.S. Cl.
CPC .. *H01L 23/49575* (2013.01); *H01L 23/49503* (2013.01); *H01L 25/162* (2013.01)

(58) Field of Classification Search
CPC . H01L 25/0655; H01L 25/072; H01L 25/162; H01L 23/49575; H01L 23/49503
USPC ......................................................... 257/676
See application file for complete search history.

(56) References Cited

U.S. PATENT DOCUMENTS

| | | | |
|---|---|---|---|
| 3,092,893 A * | 6/1963 | Cornelison | H01L 23/488 257/676 |
| 4,891,687 A * | 1/1990 | Mallik | H01L 23/49527 257/664 |
| 5,543,740 A | 8/1996 | Wong | |
| 5,828,000 A * | 10/1998 | Sano | H01L 23/057 174/548 |
| 6,323,549 B1 | 11/2001 | deRochemont et al. | |
| 7,047,637 B2 | 5/2006 | deRochemont et al. | |
| 7,068,097 B2 | 6/2006 | Atmur | |
| 7,227,198 B2 | 6/2007 | Pavier et al. | |
| 7,301,235 B2 | 11/2007 | Schaffer et al. | |
| 7,425,757 B2 | 9/2008 | Takubo | |
| 7,492,043 B2 | 2/2009 | Choi et al. | |
| 7,675,148 B2 | 3/2010 | Lim et al. | |
| 7,736,397 B2 | 6/2010 | Lee et al. | |
| 8,198,139 B2 | 6/2012 | Yang | |
| 8,604,611 B2 | 12/2013 | Hauenstein | |

(Continued)

FOREIGN PATENT DOCUMENTS

| | | | | |
|---|---|---|---|---|
| DE | 102011113244 | * | 3/2013 | ........... H01L 23/495 |
| EP | 1174921 | * | 1/2002 | ........... H01L 23/495 |

(Continued)

OTHER PUBLICATIONS

Machine translation, Kuro, Japanese Pat. Pub. No. JP H5-343454, translation date: Apr. 4, 2019, Espacenet, all pages. (Year: 2019).*

*Primary Examiner* — Victoria K. Hall
(74) *Attorney, Agent, or Firm* — Brake Hughes Bellermann LLP

(57) ABSTRACT

In a general aspect, a multi-chip semiconductor device package assembly can include a leadframe having a first die pad and a second die pad. The assembly can further include a first semiconductor die coupled to the first die pad and a second semiconductor die coupled to the second die pad. The assembly can also include a blank having a first portion coupled to the first die pad and a second portion coupled to the second die pad, such that the blank forms a bridge between the first die pad and the second die pad.

20 Claims, 6 Drawing Sheets

(56) References Cited

U.S. PATENT DOCUMENTS

| | | | |
|---|---|---|---|
| 8,772,913 B1* | 7/2014 | Muniandy | H01L 23/367 257/675 |
| 2005/0133896 A1* | 6/2005 | Liu | H01L 23/3107 257/678 |
| 2007/0262432 A1* | 11/2007 | Otremba | H01L 23/3142 257/678 |
| 2008/0023807 A1 | 1/2008 | Noquil et al. | |
| 2008/0290484 A1* | 11/2008 | Low | H01L 21/565 257/675 |
| 2009/0001562 A1* | 1/2009 | Otremba | H01L 24/24 257/723 |
| 2009/0057929 A1* | 3/2009 | Sasaki | H01L 23/3107 257/796 |
| 2009/0093090 A1* | 4/2009 | Ewe | H01L 23/3107 438/123 |
| 2009/0140414 A1* | 6/2009 | Soyano | H01L 25/072 257/698 |
| 2011/0260314 A1 | 10/2011 | Minotti | |
| 2012/0098110 A1* | 4/2012 | Zitzlsperger | H01L 23/3107 257/666 |
| 2012/0164794 A1* | 6/2012 | Xue | H01L 23/49503 438/123 |
| 2013/0062722 A1* | 3/2013 | Hoeglauer | H01L 23/49513 257/467 |
| 2013/0099364 A1 | 4/2013 | Liu et al. | |
| 2013/0105953 A1* | 5/2013 | Kim | H01L 23/4334 257/666 |
| 2014/0159248 A1* | 6/2014 | Mohammed | H01L 25/0652 257/774 |
| 2014/0252574 A1* | 9/2014 | Nakabayashi | H01L 33/62 257/666 |
| 2015/0131232 A1* | 5/2015 | Ishino | H01L 23/4334 361/707 |
| 2015/0348889 A1* | 12/2015 | Tsai | H01L 23/49503 257/676 |
| 2018/0040487 A1* | 2/2018 | Takahashi | H01L 23/50 |
| 2018/0068934 A1* | 3/2018 | Cho | H01L 23/49548 |

FOREIGN PATENT DOCUMENTS

| | | | | |
|---|---|---|---|---|
| JP | H5-343454 | * | 12/1993 | H01L 21/56 |
| WO | WO 03/063236 | * | 7/2003 | H01L 23/10 |

* cited by examiner

MULTI-CHIP PACKAGES WITH STABILIZED DIE PADS

TECHNICAL FIELD

This description relates to semiconductor device package assemblies, and corresponding methods of manufacture. More specifically, this description relates to multi-chip semiconductor device package assemblies with stabilized die pads.

BACKGROUND

Multiple-chip (multi-chip) semiconductor device packages assemblies are used in a number of applications, such as in power converters, telecommunications devices, etc. Such a multi-chip semiconductor device package assembly can include a leadframe that has multiple die pads, to which respective semiconductor die of the assembly can be coupled. Such an assembly can also include one or more signal leads that provide electrical access to the semiconductor die of the assembly. The semiconductor die can be electrically coupled with the signal leads using wire bonding (e.g., ball bonding, wedge bonding, etc.), where a wire is attached between a semiconductor die and a signal lead. In current implementations, wire bonds in such multi-chip assemblies can have quality and/or reliability issues, such as bonds that do not adhere, or are irregularly formed. Such issues can be caused by lack of stability of the die pads of leadframe during the wire bonding process, e.g., such as due to deflection of the die pad (and the corresponding semiconductor die).

SUMMARY

In a general aspect, a multi-chip semiconductor device package assembly can include a leadframe having a first die pad and a second die pad. The assembly can further include a first semiconductor die coupled to the first die pad and a second semiconductor die coupled to the second die pad. The assembly can also include a blank having a first portion coupled to the first die pad and a second portion coupled to the second die pad, such that the blank forms a bridge between the first die pad and the second die pad.

In another general aspect, a multi-chip semiconductor device package assembly can include a leadframe having a first die pad, a second die pad, a first signal lead, a second signal lead, a third signal lead, and a fourth signal lead. The assembly can also include a first semiconductor die coupled to the first die pad. A first side of the first semiconductor die can be electrically coupled with the first signal lead. The assembly can further include a second semiconductor die coupled to the second die pad. A first side of the second semiconductor die can be electrically coupled with the second signal lead. The assembly can still further include a blank having a first portion coupled to the first die pad and a second portion coupled to the second die pad. The blank can form a bridge between the first die pad and the second die pad. The assembly can also include a first wire bond electrically coupling a second side of the first semiconductor die with the third signal lead, and a second wire bond electrically coupling a second side of the second semiconductor die with the fourth signal lead.

In another general aspect, a method can include providing a leadframe including a first die pad and a second die pad. The method can also include affixing a first semiconductor die to the first die pad and affixing a second semiconductor die to the second die pad. The method can further include affixing a blank to the first die pad and the second die pad. A first portion of the blank can be coupled to the first die pad and a second portion of the blank can be coupled to the second die pad, such that the blank forms a bridge between the first die pad and the second die pad.

BRIEF DESCRIPTION OF THE DRAWINGS

In the drawings, which are not necessarily drawn to scale, like numerals may reference similar components in different views. The drawings illustrate generally, by way of example, but not by way of limitation, various embodiments discussed in the present document.

Figure 1A:
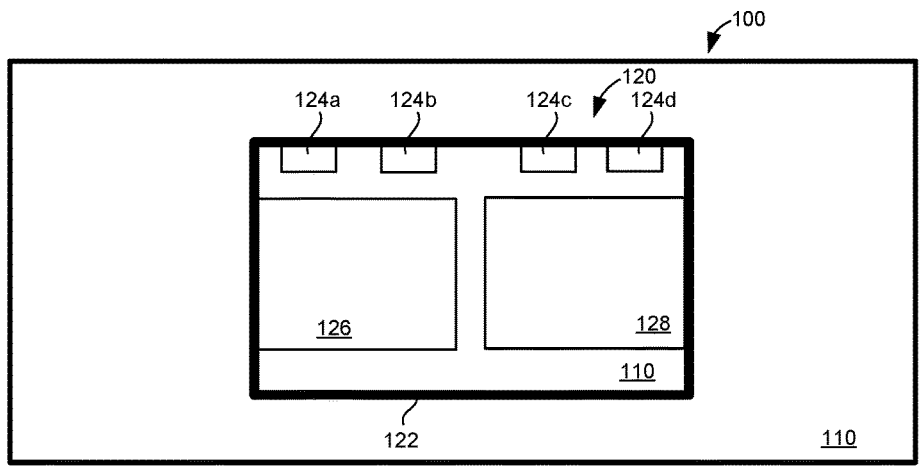
FIG. 1A is a schematic, plan view diagram of an apparatus including a leadframe for a multi-chip semiconductor device package assembly.

Like reference symbols in the various drawings indicate like and/or similar elements. Reference symbols show in one drawing may not be repeated for the same element in related views. Reference symbols repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

This disclosure relates to semiconductor device package assemblies (package assemblies, packages, assemblies, etc.) and associated methods of manufacture. More specifically, this disclosure relates to multi-chip package assemblies, e.g., package assemblies that include multiple semiconductor die, where each semiconductor die of a given assembly is mounted on a respective die pad (e.g., pad, die attach pad, paddle, die paddle, die attach paddle, etc.) of a leadframe. The package assemblies described herein can include a blank die, dummy die, a blank disc, etc., that is configured to provide mechanical stability (support) to die pads of an associated leadframe, such as during a wire bonding process. For purposes of this disclosure, such materials that are used to provide mechanical stability (support) to die pads of a leadframe are referred to as a blank (or blanks). In some implementations a blank can be a semiconductor die. A semiconductor die that is used as a blank can exclude circuitry, or can include non-functional, or inactive circuitry.

In other implementations, the blank can be a slug, chip, etc., that is formed from a conductive or non-conductive material (examples of which are discussed below). A blank can be configured to be coupled with (coupled to, etc.), and provide mechanical support to die pads of a leadframe, such as using the approaches described herein.

In the implementations described herein, a blank (or blanks) can be used to provide mechanical stability (e.g., prevent deflection of) die pads and corresponding semiconductor die coupled to those die pads during wire bonding. For instance, a blank can be coupled to adjacent pads such that the blank forms (e.g., defines) a bridge (a mechanical structure) between the adjacent die pads and, as a result, provides mechanical support to the die pads. This mechanical support can prevent, or at least reduce, deflection (or other deformation) of the die pads during a wire bonding process, which can improve the quality and reliability of wire bonds formed in such multi-chip package assemblies.

FIG. 1A is a schematic, plan view diagram of an apparatus 100 that can be used to implement a multi-chip semiconductor device package assembly. As shown in FIG. 1A, the apparatus includes a carrier 110 and a leadframe 120 that is disposed on the carrier 110. In the apparatus 100, the carrier 110 can be a tape, a substrate, a fixture, etc., where the carrier 110 is used to support and/or secure the leadframe 120 during one or more assembly manufacturing operations, such as wire bonding, for example.

As shown in FIG. 1, the leadframe 120 can include a tie-bar 122; signal leads 124a, 124b, 124c and 124d; a first die pad 126; and a second die pad 128. As shown in FIG. 1A, the tie-bar 122 can be configured to secure the signal leads 124a-124d (which can be collectively referred to as signal leads 124), the first die pad 126 and the second die pad 128 in fixed positions, relative to one another, during assembly manufacturing operations. In some implementations, multiple leadframes 120 can be implemented in a strip or a matrix that is disposed on the carrier 110, where those multiple leadframes 120 are processed together to produce respective multi-chip assemblies. In such implementations, the individual assemblies can be separated (singulated) from one another (e.g., after a molding operation that encapsulates the assemblies. Such singulation can include cutting (e.g., with a saw or laser) to separate the individual assemblies from each other. Such a singulation process can also include removing the tie-bar 122 from an associated multi-chip package assembly.

In some implementations, the carrier 110 can include (be formed from) a material (or materials) with some amount of elasticity, which can help prevent damage to components (such as semiconductor die) of a corresponding multi-chip assembly during the assembly manufacturing process. Such elasticity can, however, due to lack of mechanical support from the tie-bar 122, allow for deflection and or deformation of the die pads 126 and 128 during a wire bonding process (e.g., when forming bonds on respective semiconductor die coupled to the die pads 126 and 128). By adding additional mechanical support to the die pads 126 and 128 using the approaches described herein, this deflection can be reduced, or eliminated, which can provide for reduced variation in wire bonding conditions and, as a result, improve quality and reliability of corresponding wire bonds.

Figure 1B:
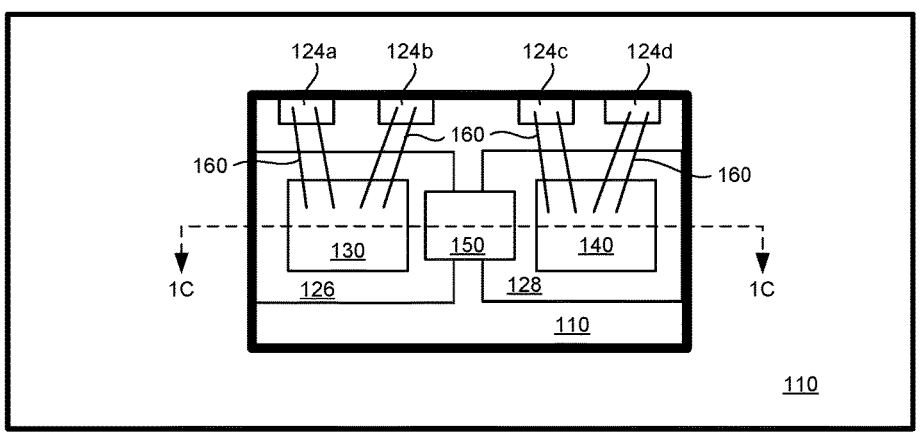
FIG. 1B is a schematic, plan view diagram of a multi-chip semiconductor device package assembly implemented using the leadframe of FIG. 1A.

FIG. 1B is a schematic, plan view diagram of a multi-chip semiconductor device package assembly implemented using the leadframe 120 of FIG. 1A. As shown in FIG. 1B, the multi-chip semiconductor device package assembly includes a first semiconductor die 130, a second semiconductor die 140, a blank 150 and wire bonds 160. The first semiconductor die 130 is coupled (e.g., attached, affixed, mounted, etc.) to the first die pad 126 and the second semiconductor die 140 is coupled to the second die pad 128. In some implementations, more than one semiconductor die could be coupled to each of the first die pad 126 and/or the second die pad 128. In this example, the semiconductor die 130 and 140 can be referred to as active semiconductor die, which include active and functional circuitry, as compared to a blank or dummy die (e.g., used to implement the blank 150) that does not include functional circuit.

The particular circuitry implemented on the active semiconductor die 130 and 140 will vary depending on the particular implementation. The semiconductor die 130 and 140 can be coupled, respectively, to the die pads 126 and 128 using a number of approaches. For instance, the semiconductor die 130 and 140 can be coupled to the die pads 126 and 128 using a conductive adhesive, using eutectic die attach, can be flip chip mounted (e.g., using solder bumps), and so forth. The sides of the die 130 and 140 on which the wire bonds are attached (formed, disposed, etc.) can be referred to as respective first (top, upper, etc.) sides of the die 130 and 140, and the electrical connections to the signal leads 124a-124d can be referred to as being to the first sides of the die 130 and 140 in this example. Further, the sides of the die 130 and 140 that are coupled to the die pads 126 and 128 can be referred to as respective second (bottom, lower, etc.) sides of the die 130 and 140, to which electrical connections (to other signal leads, such as described below) can be made. Depending on the particular implementation, a signal lead, as discussed herein, can be used for providing a power supply voltage, a control signal, a data signal, etc. to one or more of the die 130 and 140, in this example.

As shown in FIG. 1B, the blank 150 can be coupled to both the first die pad 126 and the second die pad 128, such that the blank 150 bridges (e.g., forms a bridge, or mechanical structure) between the die pads 126 and 128. In such implementations, the blank 150 can provide mechanical support (in addition to mechanical support provided by the tie-bar 122) to the die pads 126 and 128 that prevents deflection or deformation (e.g., into the page in FIGS. 1B and 1n a direction along the axis D in FIGS. 1C and 1D) of the die pads 126 and 128 during formation of wire bonds 160 on the semiconductor die 130 and 140. In some implementations, such as shown in FIG. 1B, the blank 150 can centered (e.g., vertically and/or horizontally) between the semiconductor die 130 and 140. In other implementations, the blank 150 can be shifted to the left or right relative to the semiconductor die 130 and 140, and/or the blank 150 can be shifted up or down relative to the semiconductor die 130 and 140. A surface area of the blank 150 can be smaller, equal to, or larger than a surface are of the semiconductor die 130a 140. Semiconductor die 130 and 140 can have the same surface area, or can have different surface areas.

As illustrated in FIG. 1B, respective wire bonds 160 can be formed between the semiconductor die 130 and 140, and the signal leads 124a-124d, to electrically couple the semiconductor die 130 and 140 with the signal leads 124a-124d. The arrangement of the wire bonds 160 in FIG. 1B is given by way of example, and other arrangements are possible. For instance, the particular arrangement of the wire bonds 160 of such a multi-chip package assembly will depend on the particular implementation, including the circuitry implemented on the semiconductor die 130 and 140.

Figure 1C:
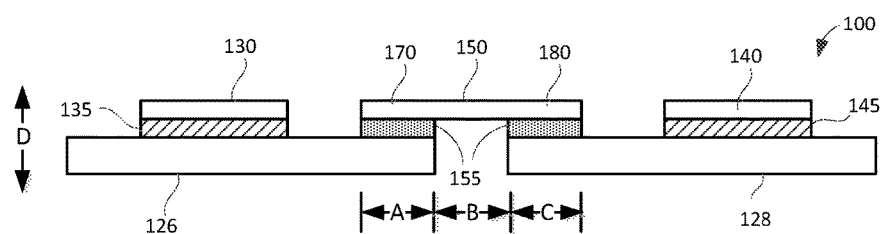
FIG. 1C is a schematic, side view diagram of the multi-chip semiconductor device package assembly of FIG. 1B.

FIG. 1C is a schematic, side view diagram of the multi-chip semiconductor device package assembly of FIG. 1B along the section line 1C-1C shown in FIG. 1B. Additionally, for purposes of clarity in the side view of FIG. 1C, the carrier 110 and the tie-bar 122 are not shown. In FIG. 1C, the semiconductor die 130 is attached to the die pad 126 with a die attach material 135, while the semiconductor die 140 is attached to the die pad 128 with a die attach material 145. In some implementations the die attach materials 135 and 145 can be a same material, while in some implementations the die attach materials 135 and 145 can be different materials. The particular die attach materials (which can be those described herein) can vary depending on the particular implementation.

As also shown in FIG. 1C, a first portion 170 of the blank 150 can be coupled (attached, affixed, etc.) to the first die pad 126 with an adhesive material 155, and a second portion 180 of the blank 150 can be coupled to the second die pad 128 with the adhesive material 155. In some implementations, different adhesive materials can be used to couple the blank 150 with, respectively, the die pad 126 and the die pad 128. As illustrated in FIG. 1C, the blank 150, once coupled with the die pads 126 and 128, forms a bridge (a mechanical structure, a mechanical support, etc.) between the die pads 126 and 128, which, as discussed above, can improve the quality and reliability of the wire bonds 160 of the package assembly shown, for example, in FIG. 1B. Depending on the particular implementation, a thickness (e.g., along the axis D in FIGS. 1C and 1D) of the adhesive 145 can be the same as, or different than a thickness (e.g., along the axis D in FIGS. 1C and 1D) of the adhesive 155.

Also, as illustrated in FIG. 1C, in some implementations, a gap between the die pad 126 and the die pad 128 can be a distance B. In other words, a length of a bridge defined by the blank 150 can be the distance B (or length B). A width of the first portion 170 of the blank 150 (that is coupled to the die pad 126) can be a distance A, while a width of the second portion 180 of the blank 150 (that is coupled to the die pad 128) can be a distance C. Depending on the particular implementation, the distances A, B and C can be a same distance, or can each be different distances. In some implementations, two of the distances A, B or C can a same distance, while the third distance is different. For instance, in one example, the distances A and C can be a same distance, and the distance B can be a different distance (smaller or larger) than the distances A and C.

Depending on the particular implementation, respective thicknesses of the semiconductor die 130 and 140 (e.g., along the axis D) can be a same thickness, or can be different thicknesses. Also, a thickness of the blank 150 (e.g., along the axis D) can be a same thickness as a thickness of at least one of the semiconductor die 130 and 140, or the blank 150 can have a thickness that is different than (greater than, or less than) each of the respective thicknesses of the semiconductor die 130 and 140. Further, a plane defined by an upper surface of the blank (e.g., a plane that is orthogonal to the axis D) can be coplanar with respective planes defined by upper surfaces of the semiconductor die 130 and 140, or the plane defined by the upper surface of the blank can be non-coplanar, but parallel with planes defined the upper surfaces of the semiconductor die 130 and 140. The particular arrangement will depend on the specific implementation. Further the various arrangements of the elements of the apparatus 100 discussed above can also apply to similar (or like) elements of other implementations, such as those implementations described herein.

As shown in FIG. 1C, the adhesive material 155 has a first portion disposed between the first portion 170 of the blank 150 and the first die pad 126, and a second portion disposed between the second portion 180 of the blank 150 and the second die pad 128. The first portion of the adhesive material 155 is separate from the second portion of the adhesive material 155. In other words, the adhesive material 155 has separate portions.

In some implementations, the blank 150 can be formed of a non-conductive material (such as ceramic, plastic, resin/epoxy, etc.). In some implementations, the blank 150 can be formed of a semiconductor material (e.g., can be a blank or inactive semiconductor die), or can be formed of a conductive material (such as a metal). In some implementations, the adhesive material 155 can be a non-conductive adhesive (such as an epoxy), while in some implementations, the adhesive material 145 can be a conductive adhesive (such as a metal filled adhesive). In some implementations, the blank 150 can be formed of a conductive material and the adhesive material 155 can be conductive, such that the blank 150 and the adhesive material 145 electrically couple (electrically connect) the first die pad 126 with the second die pad 128. In some implementations, the blank 150 can be formed of either a conductive or non-conductive material that includes a non-conductive coating on at least the first portion 170 and the second portion 180 of the blank 150.

Figure 1D:
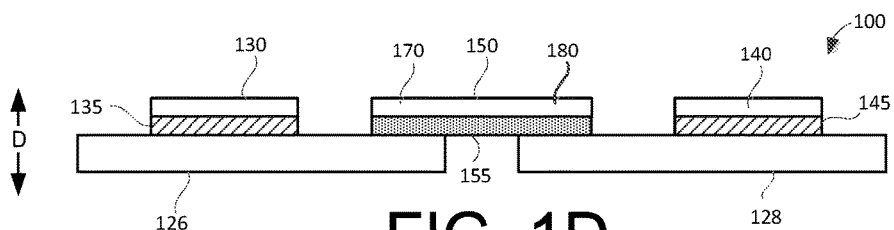
FIG. 1D is a schematic, side view diagram of another implementation of the multi-chip semiconductor device package assembly of FIG. 1B.

FIG. 1D is a schematic, side view diagram of another example implementation of the multi-chip semiconductor device package assembly of FIG. 1B along the section line 1C-1C, The implementation in FIG. 1D is similar to the multi-chip semiconductor device package assembly implementation 0 shown in FIG. 1C. Accordingly, the specifics of the multi-chip semiconductor device package assembly of FIG. 1C are not repeated here. The multi-chip semiconductor device package assembly of FIG. 1D differs from the multi-chip semiconductor device package assembly of FIG. 1C in that the adhesive 155, as shown in FIG. 1D, is disposed over an entirety, or nearly an entirety of a bottom (lower, etc.) surface of the blank 150, rather than on just the first portion 170 and the second portion 180 of the blank 150. In other words, the adhesive 155 is continuous and has a first portion. Accordingly, as shown in FIG. 1D, the adhesive material 155 has a first portion disposed between the first portion 170 of the blank 150 and the first die pad 126, and a second portion disposed between the second portion 180 of the blank 150 and the second die pad 128 where the first portion of the adhesive material 155 is contiguous with the second portion of the adhesive material 155. In other words, the adhesive material 155 does not have separate portions.

Figure 2A:
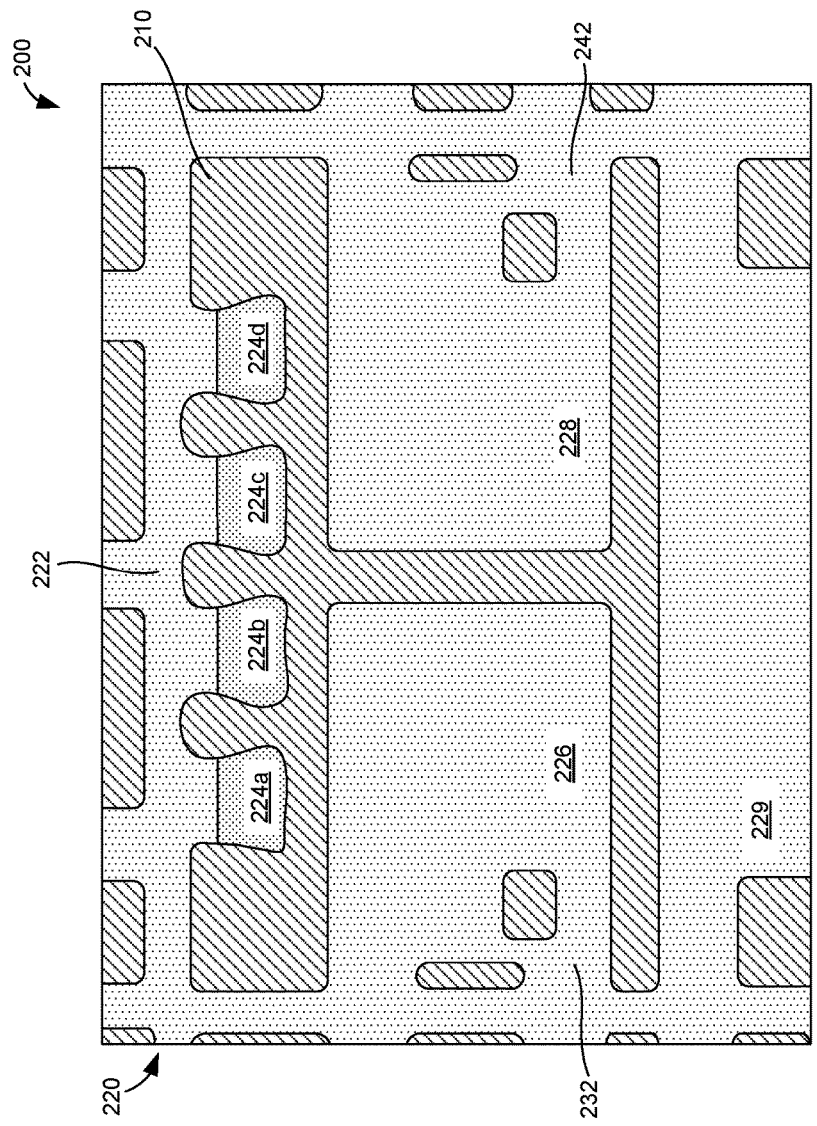
FIG. 2A is a plan view diagram of another apparatus including a leadframe for a multi-chip semiconductor device package assembly.

FIG. 2A is a schematic, plan view diagram of an apparatus 200 that can be used to implement a multi-chip semiconductor device package assembly. As shown in FIG. 2A, similar to the apparatus 100, the apparatus 200 includes a carrier 210 and a leadframe 220 that is disposed on the carrier 210. In the apparatus 200, as with the carrier 110, the carrier 210 can be a tape, a substrate, a fixture, etc., where the carrier 210 is used to support and/or secure the leadframe 220 during one or more assembly manufacturing operations, such as wire bonding, for example.

As shown in FIG. 2A, the leadframe 220, similar to the leadframe 120, can include a tie-bar 222; signal leads 224a, 224b, 224c and 224d; a first die pad 226; and a second die pad 228. The leadframe 220 can also include a third die pad 229. In some implementations, the die pads 226, 228 and/or 229 can also be used to define additional signal leads of the package assembly 200, such as with the tab 232 and/or the tab 242 shown in FIG. 2A, for example.

As with the tie-bar 122, the tie-bar 222 can be configured to secure the signal leads 224a-224d, the first die pad 226, the second die pad 228, and the third die pad 229 in fixed positions, relative to one another, during assembly manufacturing operations. In some implementations, multiple leadframes 220 can be implemented in a strip or a matrix that is disposed on the carrier 210, where those multiple leadframes 220 can be processed together to produce respective multi-chip assemblies. In such implementations, the individual assemblies can be separated (singulated) from one another (e.g., after a molding operation that, at least in part, encapsulates the assemblies). Such singulation can include cutting (e.g., with a saw or laser) to separate the individual assemblies from each other. Such a singulation process can also include removing the tie-bar 222 from an associated multi-chip package assembly, which can expose (allow access to) the signal leads 224a-224d through the molding compound.

Figure 2B:
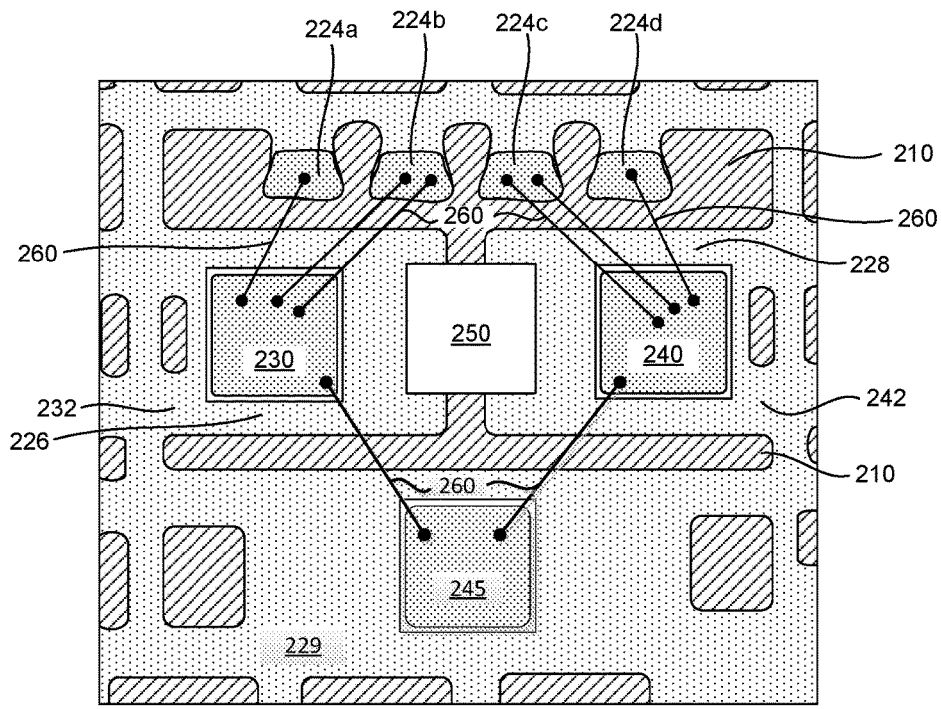
FIGS. 2B and 2C are plan view diagrams of respective multi-chip semiconductor device package assemblies implemented using the leadframe of FIG. 1A

FIG. 2B is a plan view diagram of a multi-chip semiconductor device package assembly implemented using the leadframe 220 of FIG. 2A. As shown in FIG. 2B, the multi-chip semiconductor device package assembly includes a first semiconductor die 230, a second semiconductor die 240, a third semiconductor die 245, a blank 250 and wire bonds 260. The first semiconductor die 230 is coupled to the first die pad 226, the second semiconductor die 240 is coupled to the second die pad 228, and the third semiconductor die 245 is coupled to the third die pad 229. In some implementations, more than one semiconductor die could be coupled to each of the first die pad 226, the second die pad and/or the third die pad 229. In this example, as with the semiconductor die 130 and 140, the semiconductor die 230, 240 and 245 can be referred to as active semiconductor die, which include active and functional circuitry, as compared to a blank or a dummy die (e.g., used to implement the blank 250) that does not include functional circuit. The particular circuitry implemented on the active semiconductor die 230, 240 and 245 will vary depending on the particular implementation. The semiconductor die 230, 240 and 245 can be coupled, respectively, to the die pads 226, 228 and 229 using a number of approaches, such as those described herein.

As shown in FIG. 2B, the blank 250 can be coupled to both the first die pad 226 and the second die pad 228, such that the blank 250 bridges (e.g., forms a bridge, or mechanical structure) between the die pads 226 and 228. In such implementations, the blank 250 can provide mechanical support (in addition to mechanical support provided by the tie-bar 222) to the die pads 226 and 228 that prevents deflection or deformation of the die pads 226 and 228 during formation of wire bonds 260 on the semiconductor die 230 and 240. The blank 250 and attachment of the blank 250 to the die pads of leadframe 220 can be implemented using the approaches described herein.

As illustrated in FIG. 2B, respective wire bonds 260 can be formed between the semiconductor die 230 and 240 and the signal leads 224a-224d to electrically couple the semiconductor die 230 and 240 with the signal leads 224a-224d. As also shown in FIG. 2B, wire bonds 260 can also be formed between the semiconductor die 230, 240 and 245. As with the wire bonds 160 in FIG. 1B, the arrangement of the wire bonds 260 in FIG. 2B (and in FIG. 2C) is given by way of example, and other arrangements are possible. For instance, the particular arrangement of the wire bonds 260 of such a multi-chip package assembly will depend on the particular implementation, including the circuitry implemented on the semiconductor die 230 and 240.

Figure 2C:
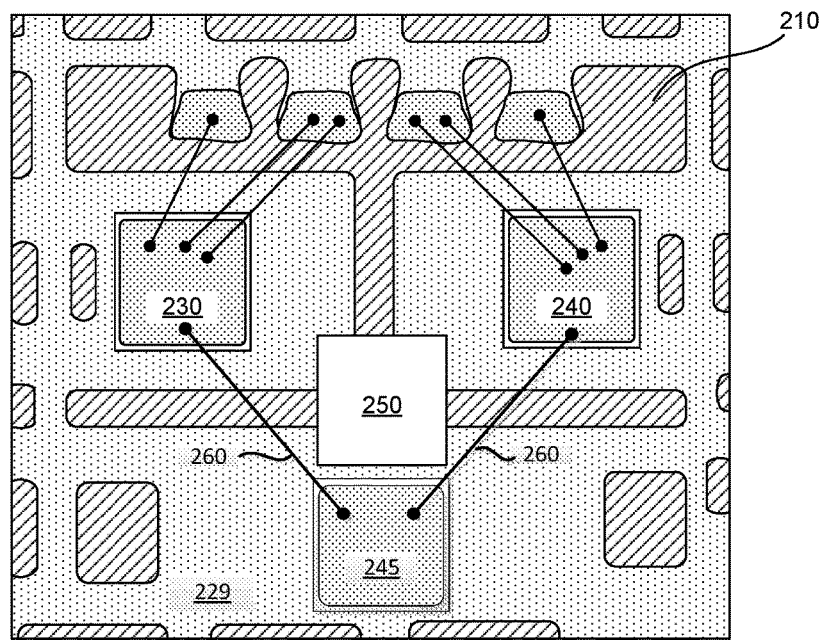

FIG. 2C is a plan view diagram of a multi-chip semiconductor device package assembly implemented using the leadframe 220 of FIG. 2A that is similar to the multi-chip semiconductor device package assembly shown in FIG. 2B. Accordingly, the specifics of the multi-chip semiconductor device package assembly of FIG. 2B are not repeated here.

The multi-chip semiconductor device package assembly of FIG. 2C differs from the multi-chip semiconductor device package assembly of FIG. 2B in that the blank 250 is coupled to the first die pad 226, the second die pad 228 and the third die pad 229. That is, in FIG. 2C the blank 250 bridges (e.g., forms a bridge, or mechanical structure) between the die pads 226, 228 and 229. In such implementations, the blank 250 can provide mechanical support (in addition to mechanical support provided by the tie-bar 222) to the die pads 226, 228 and 229 that prevents deflection or deformation of the die pads 226, 228 and 229 during formation of wire bonds 260 on the semiconductor die 230, 240 and 245. The blank 250 and attachment of the blank 250 to the die pads 226, 228 and 229 of leadframe 220 can be implemented using the approaches described herein.

Figure 3A:
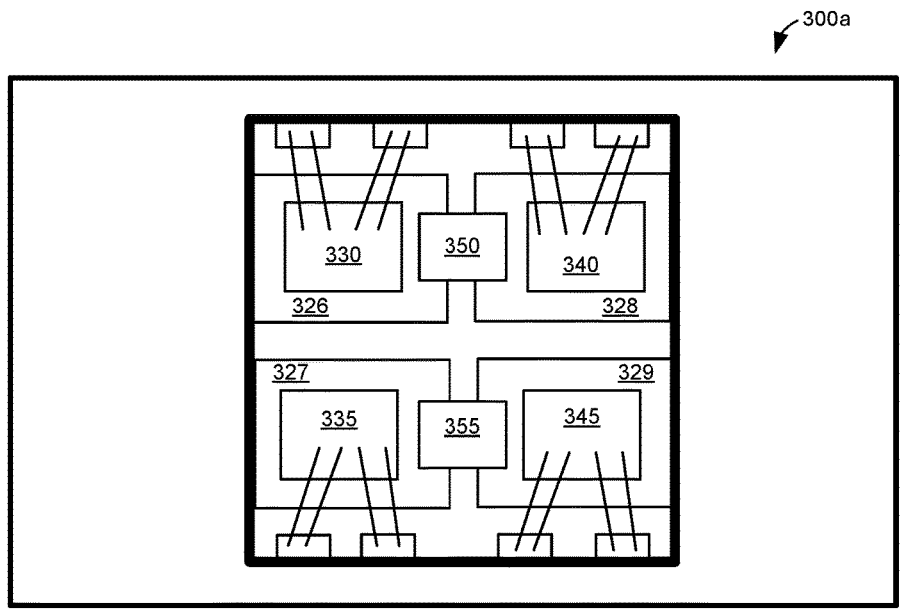
FIG. 3A is a schematic, plan view diagram of another multi-chip semiconductor device package assembly.
Figure 3B:
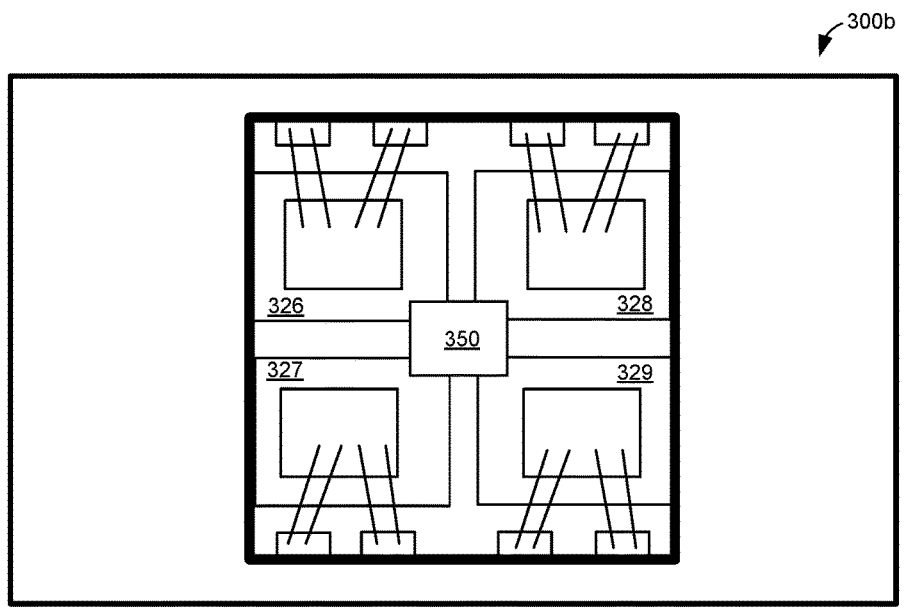
FIG. 3B is a schematic, plan view diagram of another multi-chip semiconductor device package assembly.

FIGS. 3A and 3B illustrate multi-chip semiconductor device package assemblies 300a and 300b. The assemblies 300a and 300b can be implemented using the approaches and/or materials described herein. Accordingly, for purposes of brevity, those details are not repeated again here with respect to FIGS. 3A and 3B.

Referring to FIG. 3A, the multi-chip semiconductor device package assembly 300a includes (active) semiconductor die 330, 335, 340 and 345 that are coupled, respectively to die pads 326, 327, 328 and 329. The multi-chip semiconductor device package assembly 300a of FIG. 3A also includes a first blank 350 and a second blank 355. In FIG. 3A, the first blank 350 is coupled to the die pad 326 and the die pad 328, such that the blank 350 forms a bridge (a mechanical connection, etc.) between the die pad 326 and the die pad 328. The second blank 355 of FIG. 3A is coupled to the die pad 327 and the die pad 327, such that the blank 355 forms a bridge (a mechanical connection, etc.) between the die pad 327 and the die pad 329.

The multi-chip semiconductor device package assembly 300b of FIG. 3B differs from the multi-chip semiconductor device package assembly 300a of FIG. 3A in that it excludes the blank 355, and the blank 350 of the assembly 300b is coupled to all four die pads 326-329. Accordingly, the blank 350 in FIG. 3B forms a bridge (a mechanical connection, etc.) between the die pads 326, 327, 328 and 329.

Figure 4:
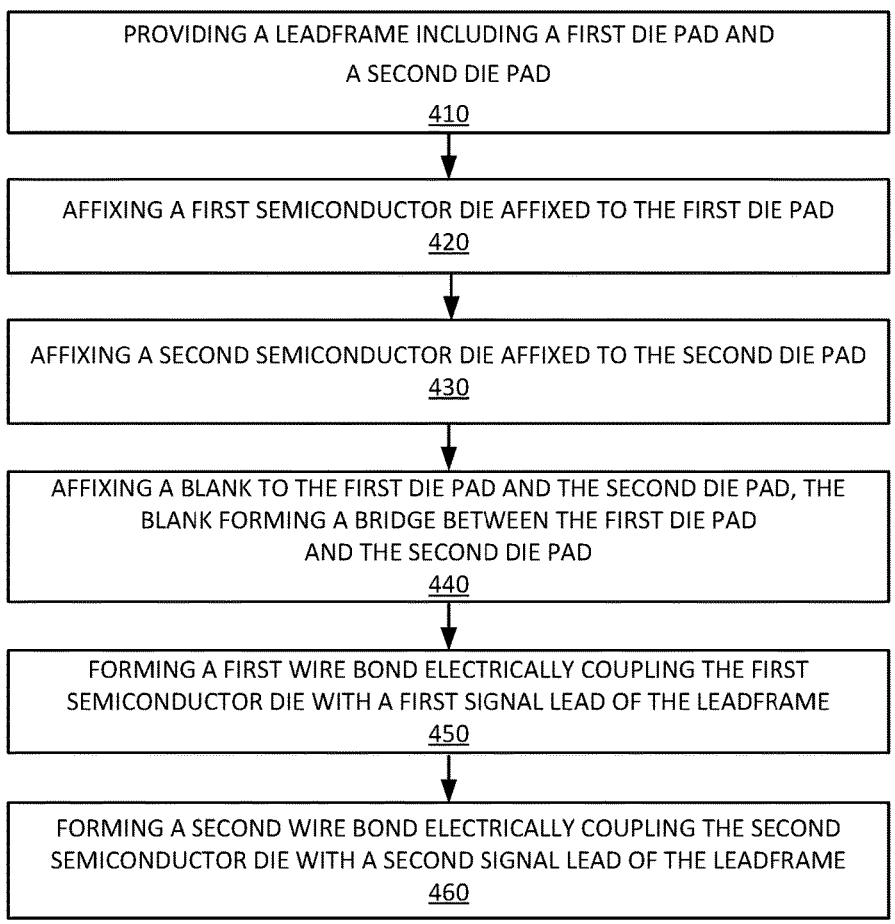
FIG. 4 is a flowchart illustrating a method for producing a multi-chip semiconductor device package assembly.

FIG. 4 is a flowchart illustrating an implementation of a method 400 that can be used to produce multi-chip semiconductor device package assemblies. For instance, the method 400 can be used to produce a packaged assembly, such as illustrated by the apparatus 100 in FIGS. 1A-1C. In some implementations, the operations of the method 400 (or similar operations) can be used to produce other implementations of multi-chip semiconductor device package assemblies, such as those illustrated in FIGS. 2A-2C and 3A-3B, for example. However, for purposes of illustration and by way of example, the method 400 will be described with further reference to the apparatus 100 illustrated in FIGS. 1A-1C. As show in FIGS. 1A and 1B and discussed above, the leadframe 120 can be provided on a carrier 110 (e.g., a tape, a substrate, etc.)

As shown in FIG. 4 (and with reference to FIGS. 1A-1C), the method 400 can include at block 410, providing the leadframe 120 including the first die pad 126 and the second die pad 128. As shown in, e.g., FIG. 1A, the leadframe 120 can be provided on the carrier 110 and can also include the tie bar 122 and signal leads (terminals, etc.) 124a-124d.

At block 420, the method 400 can include affixing the first (active) semiconductor die 130 to the first die pad 126 of the leadframe 120. Affixing the die 130 to the die pad 126 can be performed using a number of approaches. For instance, the die 130 can be coupled using a conductive adhesive, a eutectic die attach, flip chip attach, or any number of other die attach approaches appropriate for the particular implementation. At block 430, the method 400 can include affixing the second (active) semiconductor die 140 to the second die pad 128 of the leadframe 120. As with affixing the die 130 to the die pad 126, affixing the die 140 to the die pad 128 can be performed using a number of approaches, such as those noted above, as some examples.

At block 440, the method 400 can include affixing the blank 150 to the first die pad 126 and the second die pad 128, where the blank is a dummy (inactive) semiconductor die, or other material, such as those described herein. At block 440 (and as shown in FIG. 1C), the first portion 170 of the blank 150 can be coupled to the first die pad 126. Also at block 440, the second portion 180 of the blank 150 can be coupled to the second die pad 128. In this example, the blank 150, after being coupled to the first die pad 126 and the second die pad 128, can form a bridge between the first die pad 126 and the second die pad 128, such as shown in FIG. 1C. At block 440, the blank 150 can be coupled to the first die pad 126 and the second die pad 128 using a number of different approaches and/or materials, such as those discussed above.

In some implementations, affixing the blank 150 to the first die pad 126 and the second die pad 128 can be performed prior to affixing the first semiconductor die 130 to the first die pad 126 at block 420. In some implementations, affixing the blank 150 to the first die pad 126 and the second die pad 128 can be performed after affixing the first semiconductor die 130 to the first die pad 126 at block 420, but prior to affixing the second semiconductor die 140 to the second die pad 128 at block 430.

At block 450, the method 400 can include forming a first wire bond 160 that electrically couples the first semiconductor die 130 with a first signal lead (the signal lead 124*a* or the signal lead 124*b*) of the leadframe 120. Forming the first wire bond 160 can include forming ball bonds, wedge bonds, etc. At block 460, the method 400 can further include forming a second wire bond 160 that electrically couples the second semiconductor die 140 with a second signal lead (the signal lead 124*c* or the signal lead 124*d*) of the leadframe 120. Again, a number of approaches can be used to form the second wire bond 160 between the second semiconductor die 140 and the second signal lead (124*c* or 124*d*).

In some implementations, the method 400 can include performing additional operations for producing a multi-chip semiconductor device package assembly. For example, such operations can include a molding operation, a singulation operation, etc. Molding operations can include, e.g., compression molding, transfer molding, and so forth. Singulation operations can also be used to remove the tie bar 122 from the leadframe, and/or to expose the signal leads 124*a*-124*d* so they accessible from outside a corresponding multi-chip semiconductor device package assembly. Singulation operations can also be used to separate individual multi-chip semiconductor device package assemblies from each other, e.g., after a molding operation where a strip or matrix of leadframes are processed together. In some implementations, singulation can include, e.g., saw singulation, laser cutting singulation, etc.

Further, in some implementations, operations similar to (or the same as) those described above with respect to the method 400 can be used to produce other implementations of multi-chip semiconductor device package assemblies. For instance, such operations can be used to produce assemblies having three or more die pads, three or more (active) semiconductor die, two or more blanks, additional signal leads and/or additional wire bonds.

In the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown (e.g., in the drawings) as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. The appended claims are intended to cover all such modifications and changes as fall within the scope of the implementations. The example implementations described herein and shown in the drawings have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A multi-chip semiconductor device package assembly comprising:
   a leadframe including:
      a first die pad; and
      a second die pad;
   a first semiconductor die coupled to the first die pad;
   a second semiconductor die coupled to the second die pad; and
   a blank having a first portion coupled to the first die pad and a second portion coupled to the second die pad, such that the blank forms a bridge between the first die pad and the second die pad.

2. The multi-chip semiconductor device package assembly of claim 1, wherein the leadframe further includes a third die pad, the multi-chip semiconductor device package assembly further comprising:

a third semiconductor die coupled to the third die pad, the blank having a third portion coupled to the third die pad, such that the blank further forms:
a bridge between the third die pad and the first die pad; and
a bridge between the third die pad and the second die pad.

3. The multi-chip semiconductor device package assembly of claim 2, wherein the leadframe further includes a fourth die pad, the multi-chip semiconductor device package assembly further comprising:
a fourth semiconductor die coupled to the fourth die pad, the blank having a fourth portion coupled to the fourth die pad, such that the blank further forms:
a bridge between the fourth die pad and the first die pad;
a bridge between the fourth die pad and the second die pad; and
a bridge between the fourth die pad and the third die pad.

4. The multi-chip semiconductor device package assembly of claim 1, wherein the blank is a first blank,
the leadframe further including:
a third die pad;
a fourth die pad,
the multi-chip semiconductor device package assembly further comprising:
a third semiconductor die coupled to the third die pad;
a fourth semiconductor die coupled to the fourth die pad; and
a second blank having a first portion coupled to the third die pad and a second portion coupled to the fourth die pad, such that the second blank forms a bridge between the third die pad and the fourth die pad.

5. The multi-chip semiconductor device package assembly of claim 1, wherein the leadframe further includes:
a first signal lead; and
a second signal lead,
the multi-chip semiconductor device package assembly further comprising:
a first wire bond electrically coupling the first semiconductor die with the first signal lead; and
a second wire bond electrically coupling the second semiconductor die with the second signal lead.

6. The multi-chip semiconductor device package assembly of claim 1, wherein the blank comprises a non-conductive material.

7. The multi-chip semiconductor device package assembly of claim 1, wherein the blank comprises a conductive material.

8. The multi-chip semiconductor device package assembly of claim 7, wherein:
the first portion of the blank is coupled to the first die pad with a non-conductive adhesive; and
the second portion of the blank is coupled to the second die pad with the non-conductive adhesive.

9. The multi-chip semiconductor device package assembly of claim 7, wherein the blank electrically couples the first die pad with the second die pad.

10. The multi-chip semiconductor device package assembly of claim 1, wherein:
the first portion of the blank is coupled to the first die pad with a non-conductive adhesive; and
the second portion of the blank is coupled to the second die pad with a non-conductive adhesive.

11. The multi-chip semiconductor device package assembly of claim 1, wherein the blank includes at least one of a semiconductor material, a metal, an epoxy, a plastic or a ceramic.

12. The multi-chip semiconductor device package assembly of claim 1, wherein the blank includes a third semiconductor die, the third semiconductor die being one of an inactive semiconductor die and a dummy semiconductor die.

13. The multi-chip semiconductor device package assembly of claim 1, wherein the blank includes a non-conductive coating disposed on the first portion of the blank and the second portion of the blank.

14. A multi-chip semiconductor device package assembly comprising:
a leadframe including:
a first die pad;
a second die pad;
a first signal lead;
a second signal lead;
a third signal lead; and
a fourth signal lead;
a first semiconductor die coupled to the first die pad, a first side of the first semiconductor die being electrically coupled with the first signal lead;
a second semiconductor die coupled to the second die pad, a first side of the second semiconductor die being electrically coupled with the second signal lead; and
a blank having a first portion coupled to the first die pad and a second portion coupled to the second die pad, such that the blank forms a bridge between the first die pad and the second die pad,
a first wire bond electrically coupling a second side of the first semiconductor die with the third signal lead, the second side of the first semiconductor die being opposite the first side of the first semiconductor die; and
a second wire bond electrically coupling a second side of the second semiconductor die with the fourth signal lead, the second side fo the second semiconductor die being opposite the first side of the second semiconductor die.

15. The multi-chip semiconductor device package assembly of claim 14, wherein the blank comprises a non-conductive material.

16. The multi-chip semiconductor device package assembly of claim 14, wherein the blank comprises a conductive material.

17. The multi-chip semiconductor device package assembly of claim 16, wherein the blank electrically couples the first die pad with the second die pad.

18. A method comprising:
affixing a first semiconductor die to a first die pad included in a leadframe;
affixing a second semiconductor die to a second die pad included in the leadframe; and
affixing a blank to the first die pad and the second die pad, such that a first portion of the blank is coupled to the first die pad and a second portion of the blank is coupled to the second die pad, the blank forming a bridge between the first die pad and the second die pad.

19. The method of claim 18, further comprising:
forming a first wire bond electrically coupling the first semiconductor die with a first signal lead of the leadframe; and
forming a second wire bond electrically coupling the second semiconductor die with a second signal lead of the leadframe.

20. The method of claim 18, wherein affixing the blank to the first die pad and the second die pad includes affixing the blank to the first die pad and the second die pad with a non-conductive adhesive.

\* \* \* \* \*